United States Patent

Chang et al.

[15] 3,668,480

[45] June 6, 1972

[54] SEMICONDUCTOR DEVICE HAVING MANY FOLD IV CHARACTERISTICS

[72] Inventors: Leroy L Chang, Tarrytown; Leo Esaki, Chappaqua, both of N.Y.

[73] Assignee: International Business Machines Corporation, Armonk, N.Y.

[22] Filed: July 21, 1970

[21] Appl. No.: 57,383

[52] U.S. Cl. ....................317/234, 317/235

[51] Int. Cl. ....................H01l 3/14

[58] Field of Search ....................317/234, 235, 237

[56] References Cited

UNITED STATES PATENTS

| | | | |
|---|---|---|---|
| 2,871,377 | 1/1959 | Tyler et al. | 317/235 X |
| 3,419,764 | 12/1968 | Kasugai et al. | 317/234 |
| 3,461,359 | 8/1969 | Raithel et al. | 317/234 |
| 3,465,176 | 9/1969 | Tanaka et al. | 317/234 X |

*Primary Examiner*—James D. Kallam
*Attorney*—Hanifin and Jancin and T. J. Kilgannon, Jr.

[57] ABSTRACT

A semiconductor diode having multiple Voltage characteristics and its method of fabrication is disclosed. When a voltage is applied in the forward direction to the diode, at some threshold, the current switches to a higher value of current. A decrease of the voltage causes a decrease in the current and, after a reverse voltage applied, reverse current values of increasing magnitude are obtained until a threshold is reached. When the threshold is reached, the diode switches from a high value of reverse current to a lower value of reverse current. A decrease in the reverse voltage to zero, reduces the current to zero and, increasing the voltage in the forward direction starts the above-described cycle over again. By adjusting the forward and reverse voltages, switching may occur at values higher than the thresholds and a family of voltage-current characteristics is obtained. A typical device consists of n-conductivity type gallium arsenide into which a region of deep centers has been diffused. A typical deep center of oxygen. A semiconductor junction which is alloyed, diffused or of the Schottky barrier type is formed with the deep center region. Where the junction formed is of the alloyed type, for example, an indium-zinc alloy may be used. Finally, an ohmic contact of gold-tin is applied to the semiconductor body. Forward voltages in the neighborhood of 1 volt provide switching in the forward direction while reverse voltages of as little as 3 volts cause switching in the reverse direction. A diode fabrication technique is also disclosed.

22 Claims, 8 Drawing Figures

INVENTORS
LEROY L. CHANG
LEO ESAKI

BY Thomas J. Kilgannon Jr.
ATTORNEY

SEMICONDUCTOR DEVICE HAVING MANY FOLD IV CHARACTERISTICS

BACKGROUND OF THE INVENTION

1. Field of the Invention

This invention relates generally to semiconductor devices having many fold voltage-current characteristics and to their method of fabrication. More particularly, it relates to a semiconductor device which forms a semiconductor junction in a region of n or p-conductivity type semiconductor such as gallium arsenide into which deep centers such as oxygen or metal ions have been diffused. The resulting device is a two terminal device which may be fabricated utilizing individual steps which are well known to those in the semiconductor art. The resulting device has duplex or multiplex current-voltage characteristics and is particularly amenable for use as a memory element in arrangements which store digital data.

2. Description of the Prior Art

Devices which utilize deep trap levels are well known. However, such devices, in one instance, comprise a body of low resistivity semiconductive material which includes a narrow p-n tunneling junction having deep level trapping states within the space charge region and separate non-rectifying electrodes in contact with the body on opposite sides of the junction. In addition to being different structurally from the device of the present application, such devices do not exhibit multifold voltage-current characteristics such as obtained using the device of the present invention.

Other known arrangements exhibit negative resistance characteristics and utilize at least two deep level forming impurities in a semiconductor body. In addition, the body is contacted with two similar metal electrodes.

While the individual fabrication steps are well known to those skilled in the semiconductor fabrication art, the formation of a semiconductor junction in juxtaposition with a region of deep centers has not been found in the known prior art. The diode of the present application as fabricated by the method described herein unexpectedly provides a device which possesses multiple stable dc current-voltage characteristics which can be switched between high and low resistance states.

SUMMARY OF THE INVENTION

In accordance with the broadest aspect of the invention, a semiconductor diode which exhibits multiple current-voltage characteristics consisting of a semiconductor substrate, a region containing deep centers disposed in said substrate and a semiconductor junction electrically coupled to the deep center containing region is disclosed. The diode further includes an ohmic contact electrically coupled to the semiconductor substrate. Means for applying a voltage to the diode sufficient to cause the diode to switch between high and low resistance conditions is also disclosed.

In accordance with more particular aspects of the invention, the semiconductor substrate is characterized as being of n or p-conductivity type gallium arsenide or silicon. The semiconductor junction disposed in the deep center containing region is characterized as:

a. an alloyed region of conductive material in the deep center containing region;

b. a diffused region of dopant in the deep center containing region; and c. a Schottky barrier forming conductive material disposed in contacting relationship with the surface of the deep center containing region.

Still more specifically, the deep centers are characterized as elements such as oxygen, gold, iron, cobalt, manganese, copper, or nickel. Semiconductor dopants of n-conductivity type for gallium arsenide are tellurium, tin, selenium, and sulphur while p-conductivity type dopants are zinc and cadmium. The ohmic contact materials as well as the materials used for forming the semiconductor junction are also specifically defined. Finally, the means for applying a voltage to switch between high and low resistance conditions is characterized as a means for applying a voltage to the diode in the forward and reverse directions until the currents attained switch to higher and lower values of current, respectively.

In accordance with a further aspect of the invention, a method of fabricating a semiconductor diode which exhibits multiple current-voltage characteristics is disclosed.

In accordance with more particular aspects of the invention, first and second regions are formed in a semiconductor substrate; one of the regions being a semiconductor junction and the other being a region containing deep centers. The deep center region surrounds the semiconductor junction region. The forming of the first and second regions may be carried out by first forming a region containing deep centers in the semiconductor substrate and subsequently forming a semiconductor region in the deep center containing region. Alternatively, the first and second regions may be formed by first forming a semiconductor junction region in the semiconductor substrate and subsequently forming a region containing deep centers which encompasses the semiconductor junction region.

In accordance with still more specific aspects of the present invention, the step of forming a semiconductor junction includes:

a. alloying a conductive material with the deep center containing region;

b. diffusing a dopant of given conductivity type into said deep center containing region; and c. depositing a conductive material on a portion of the deep center containing region to form a metal semiconductor junction of the Schottky barrier type.

The step of forming a region containing deep centers may be accomplished by the diffusion or ion implantation of elements which form deep centers in the semiconductor substrate. In addition to specifically defining the various dopants, deep center materials, electrodes and ohmic contact materials, the fabrication technique includes the step of electrically forming by momentarily applying a high current through the semiconductor substrate to enhance the spread between the low and high resistance states of the diode.

It is, therefore, an object of the invention to provide a semiconductor diode which exhibits multiple voltage-current characteristics.

Another object is to provide a diode which is capable of being switched between high and low resistance states.

Still another object is to provide a method of fabricating diodes which exhibit multiple current-voltage characteristics which is simple, inexpensive, and amenable to mass production techniques.

The foregoing and other objects, features and advantages of the invention will be apparent from the following more particular description of preferred embodiments of the invention as illustrated in the accompanying drawings.

Plots of $1/C^2$ versus applied voltage for the forward and reversed polarized states are also shown.

DETAILED DESCRIPTION OF PREFERRED EMBODIMENTS OF THE INVENTION

Figure 1A:
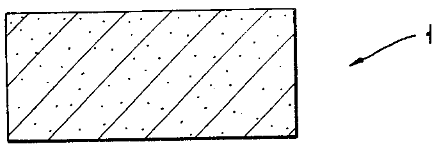
FIGS. 1A – 1F form a flow diagram showing a cross-sectional view of a semiconductor substrate at various stages of manufacture in accordance with a preferred fabrication technique which results in the novel diode of the present invention.

Referring now to FIG. 1A which shows the first step in a flow diagram of a diode of the present invention at various stages of fabrication, there is shown therein a semiconductor substrate 1 of n-conductivity type. Substrate 1 may be gallium arsenide or silicon, for example. For purposes of exposition, the fabrication of the device will be described in what follows utilizing gallium arsenide as the semiconductor material. Substrate 1 of n-conductivity gallium arsenide may be provided ab initio having the desired conductivity type or it may be obtained by diffusing an element such as tellurium, tin, selenium or sulphur into a gallium arsenide substrate using well known techniques for a time and at a temperature sufficient to provide the desired impurity concentration. A concentration of $10^{16}$ atoms/cm$^3$ is a typical carrier concentration.

Figure 1B:
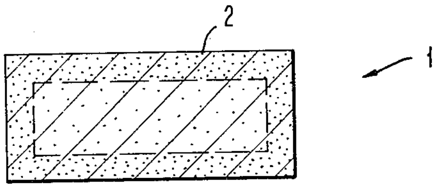

A region having deep centers is then formed in gallium arsenide substrate 1 by doping substrate 1 with an element which forms deep centers. FIG. 1B shows a cross-sectional view of gallium arsenide substrate 1 after oxygen has been diffused into it by heating substrate 1 at a temperature in the range of 600° – 800° C. in an oxygen containing atmosphere. A thin layer or region 2 containing diffused oxygen extends from the surfaces of the gallium arsenide substrate into the substrate for a depth less than 1 micron. Layer or region 2 containing deep centers is of relatively high resistivity though it is not intrinsic in nature. While oxygen has been suggested as exemplary of an element which creates deep levels within layer or region 2, it should be appreciated that other elements such as gold, iron, cobalt, manganese, copper, or nickel also create deep centers or levels when diffused into an appropriate semiconductor material.

Figure 1C:
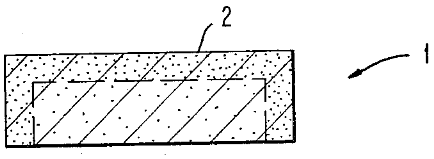

Referring now to FIG. 1C, substrate 1 is lapped on a lapping machine to remove the bottom portion of layer 2 to provide a region free of deep centers to which an ohmic contact may be subsequently applied.

Figure 1D:
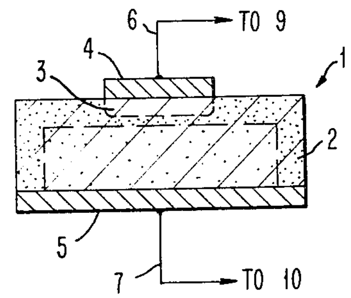

FIG. 1D shows gallium arsenide substrate 1 with an alloyed region 3 disposed in deep center containing region 2. Alloyed region 3 results from subjecting electrode 4 (which has been deposited previously on the surface of substrate 1 by vacuum evaporation or other suitable technique and then delineated by etching) to a short period heating at a temperature in the range of 700° – 800° C. which results in shallow alloying of electrode 4 and diffusion of the constituents involved. Electrode 4 may be, for example, an indium-zinc alloy containing 97 percent indium and 3 percent zinc.

Alloying is carried out at a selected temperature for a time sufficient to cause the desired alloying and diffusion but, for a time insufficient to permit penetration of the alloyed region beyond the depth of layer or region 2. An ohmic contact 5 of a gold-tin alloy, for example, is then applied to the lapped surface of substrate 1. Interconnections 6 and 7, connected to electrode 4 and ohmic contact 5, respectively, are utilized to provide an interconnection with a voltage source 8 shown in FIG. 1G via interconnections 9 and 10 and load resistor 11. Voltage source 8 may be any source of dc voltage which is variable over a range of positive and negative voltages or it may be a pulsed source which is capable of providing pulsed positive and negative voltages at interconnections 9 and 10.

In connection with ohmic contact 5, it should be appreciated that any well known metal or metal alloy which forms an ohmic contact may be utilized in the practice of the present invention. Also, in connection with electrode 4, other suitable materials which are capable of forming p-n junctions with n-type gallium arsenide are metals such as indium and platinum and alloys such as indium-cadmium alloys. It is, of course, understood that any metal or alloy capable of forming a p-conductivity type alloyed region is suitable for use in the fabrication of the diode of the present invention.

Figure 1E:
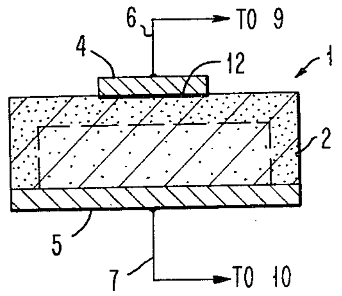

FIG. 1E is similar to the diode shown in FIG. 1D except that the alloyed region 3 which forms a p-n junction in region 2 is replaced by a semiconductor junction of the metal-semiconductor Schottky barrier type. Thus, a platinum electrode 4 may be deposited and delineated by well known techniques on the surface of gallium arsenide wafer 1. The desired semiconductor junction is formed at an interface 12 between electrode 4 and the surface of deep center containing region 2. Interconnections 6 and 7 which are connected to electrode 4 and ohmic contact 5, respectively, are connected to interconnections 9 and 10 of FIG. 1E.

Electrode 4, in addition to platinum, may be palladium, gold, silver, or molybdenum.

Figure 1F:
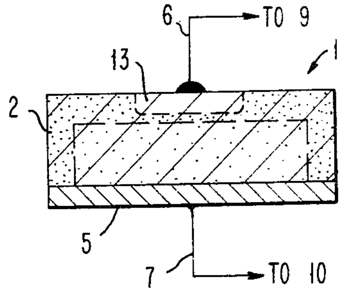

Referring now to FIG. 1F, a diode similar to that shown in FIG. 1D is shown except that alloyed region 3 is replaced by a diffused region 13 which is disposed within region 2 and is formed by diffusing p-conductivity type dopants into gallium arsenide substrate 1. Thus, elements such as zinc and cadmium which form p-conductivity type regions in gallium arsenide may be utilized to form region 13 utilizing any technique well known to those skilled in the semiconductor fabrication art. It is, of course, obvious that any material which forms a diffused p-conductivity type region in region 2 may be utilized in the practice of the present invention. In connection with both the alloyed region 3 of FIG. 1D and the diffused region 13 of FIG. 1F, these regions are formed to a depth which is less than the depth of region 2. In no instance, should alloyed region 3 or diffused region 13 penetrate beyond the depth of region 2.

While the foregoing has dealt with n-conductivity type gallium arsenide and other specific materials, it should be appreciated that the diode of the present invention may be fabricated using p-conductivity type gallium arsenide as a starting material. Thus, substrate 1 of FIG. 1A may be gallium arsenide which is doped with a p-conductivity type dopant such as zinc or cadmium. Region 2 containing deep centers of FIG. 1B is formed in the same way as described in connection with FIG. 1B and elements such as oxygen, gold, iron, cobalt, zinc, manganese, copper or nickel may be utilized. In forming alloyed region 3 of FIG. 1D using p-conductivity type gallium arsenide, electrode 4 may consist of zinc, cadmium, tin, tellurium, selenium containing alloys or sulphur containing alloys. Electrode 4 of FIG. 1E may be formed of platinum, gold, silver, molybdenum, or palladium in the same manner as described in connection with FIG. 1E hereinabove. Where the arrangement shown in FIG. 1F utilizes a p-conductivity type gallium arsenide substrate 1, n-type dopants such as tellurium and selenium may be utilized to form diffused region 13. Ohmic contact 5 may be of a gold-cadmium alloy or any other material which provides an ohmic contact to p-conductivity type gallium arsenide.

Figure 2:
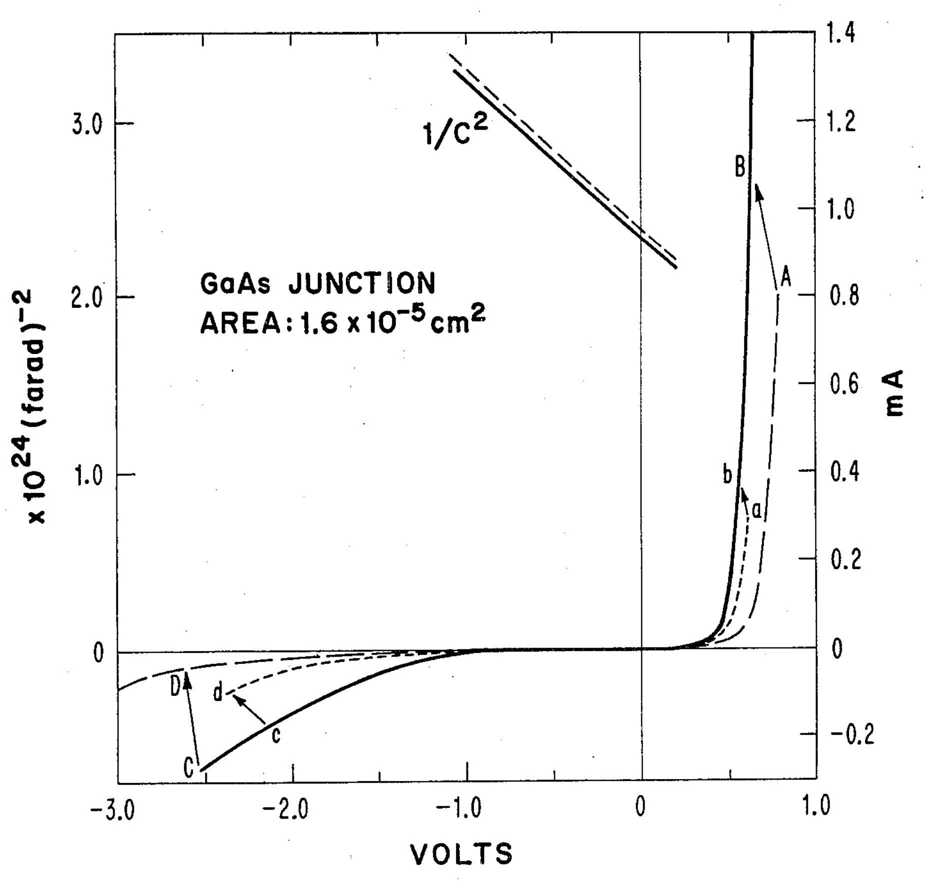
FIG. 2 shows a duplex current-voltage characteristics which include switching paths A–B and C–D for a unit made with a platinum electrode which forms a Schottky barrier type semiconductor junction or for a unit made with an indium-zinc alloy which forms an alloyed semiconductor junction. The solid and long dashed curves show the forward and reverse polarized states (FP and RP), respectively. The short dashed line shows one of a plurality of intermediate polarized states which the diode of the present invention can assume.

The foregoing fabrication technique, whether the starting material be n or p-conductivity type gallium arsenide, provides diodes which exhibit the duplex voltage-current characteristics shown in FIG. 2. It has been found, however, that if the devices resulting from the above-described fabrication steps are subjected to a forming technique, the spread between the high and low resistance states exhibited by the diodes of the present invention is enhanced. The forming technique consists in applying momentarily a high current through the semiconductor junction of the devices shown in FIGS. 1D, 1E and 1F. The application of the momentary high current through these devices has the effect of eliminating residual oxide films or other imperfection in the junction regions which tend to reduce the difference between the high and low resistance states.

Also, in the above-described fabrication technique, the fabrication of the diode of the present invention shows the formation of the deep center region 2 taking place prior to the formation of the semiconductor junctions which result from alloyed region 3 in semiconductor substrate 1, diffused region 13 in semiconductor 1 and metal-semiconductor junction 12 of the Schottky barrier type. It should be appreciated that the fabrication technique is not limited to the above-described approach and that, as an alternative approach, the semiconductor junctions may be formed first and the deep center layer 2 formed subsequently. In this regime, the semiconductor junctions are formed as described hereinabove; the deep center diffusion is carried out; substrate 1 is lapped and ohmic contact 5 is applied. Once interconnections 6, 7 are applied, the device is complete.

In connection with the formation of deep centers, it should be appreciated that any of the elements mentioned hereinabove as deep centers may not remain in their elemental state but may form complexes with other impurities, defects or vacancies.

Referring now to FIG. 2, the current-voltage characteristic of a device similar to that shown in FIG. 1E and using a platinum electrode 4 is shown. The current-voltage characteristic of FIG. 2 may be expressed by the $\exp(qV/nkT)$ dependence where n is 1.5 to 3 and is smaller for the forwardly polarized state and wherein $q$ is the electronic charge, $1.6 \times 10^{-19}$ coulombs;

V is the voltage in volts;

K is the Boltzmann constant; and

T is the temperature in K°.

The plot $1/C^2$ versus applied voltage for the forward and reverse polarized state show a straight line relationship for each state the slope of which is consistent with the originial donor concentration. The obtained space charge width at zero bias, however, is wider by several hundred angstroms than that expected from the original donor concentration. This is believed to be due to deep levels created by oxygen and oxygen in combination with other impurities. The measured capacitance of the forwardly polarized state is approximately 1 percent larger than that of the reverse polarized state at the same bias voltage.

The observed increase in capacitance in the transition from the RP state to the FP state (the transition from A to B in FIG. 2) could be interpreted by an assumption that the deep centers become more positively charged possibly by trapping holes. Thus, the space charge width is narrowed due to an increase, ΔN, in the effective donor concentration N. Using a simple model, $$\Delta N \sim N(\Delta C/C) \sim 8 \times 10^{14} \text{ cm}/^{-3},$$

in the sample shown in FIG. 2. Since the junction width of the device having the characteristics shown in FIG. 2 is about 2,000 A, the total charge change associated with the transition of the centers is approximately $e \times 1.6 \times 10^{10}$ cm$^{-2}$. This means that the difference of the stored-charge between two states is only $1.6 \times 10^{19} \times 1.6 \times 10^{10} \times 2 \times 10^{-5} \sim 5 \times 10^{-14}$ coulomb per device. Perhaps a more important consequence than the stored charge is the fact that each state of the center has its own characteristic electron-hole recombination time constant or its own characteristic energy level in the energy gap. The different recombination time constants lead to considerably different voltage dependencies of the generation-recombination current which is believed to be primarily responsible for the observed duplex-multiplex characteristics shown in FIG. 2.

Figure 1G:
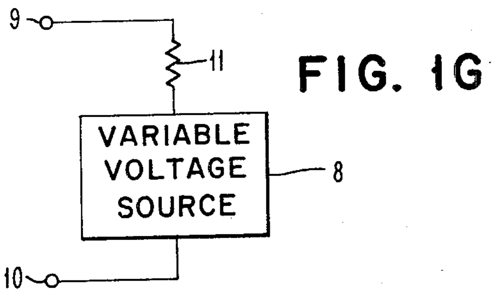
FIG. 1G shows a variable voltage source and load which may be utilized to obtain the current-voltage characteristics of the diodes of the present application.

The voltage-current characteristics of FIG. 2 were obtained utilizing the device of FIG. 1E connected to voltage source 8 of FIG. 1G via interconnections 9 and 10 and load device 11. Load device 11 is a resistor of 50 ohms.

Voltage source 8 which may be a pulsed source or a source of variable dc voltage is adjusted to apply a positive voltage to the device of FIG. 1E. As the voltage is increased, the current obtained follows the reversly polarized (saturated) state shown by the long dashed lines in FIG. 2. At a value of voltage less than 1 volt and at a current of approximately 0.8 ma, and shown as point A, the current through the diode under test switches abruptly to point B on the solid line curve which is the forwardly polarized (saturated) state of the device. Point A on the long dashed line curve of FIG. 2 represents a minimum threshold voltage at which the device under test switches from a low current or high resistance to a high current or low resistance condition. Once the device has switched, if the voltage is reduced to zero and negative voltages applied, the current obtained will follow along the solid curve from B to C exhibiting a relatively high negative current in excess of −0.2 ma at approximately −2.5 volts. At this point (C in FIG. 2), another threshold is reached and the diode switches abruptly from a low resistance condition to a high resistance condition; that is, from point C on the solid line curve of FIG. 2 to point D on the long dashed line curve which are the forwardly and reversely polarized states, respectively, of the device under test. By changing the voltage in a positive direction, the current follows the long dashed line path from D to A at which latter point the current again switches abruptly to point B on the solid curve shown in FIG. 2, thereby recycling the device in the manner just described.

While the foregoing conditions described in connection with FIG. 2 are saturated conditions, it should be appreciated that intermediate polarized states can be achieved. Thus, switching may take place along *c–d* at a lower applied voltage than the voltage at which the transition C–D occurs. If the applied voltage is released at point *d*, the device is locked into one of the intermediate polarized states shown by the short dashed line curve of FIG. 2. This intermediate polarized state has a substantially lower threshold for switching to the forwardly polarized (FP) state from *a* to *b*. In any event, the switching current and voltage, as well as switching time constants, are functions of the magnitude of the preceding polarization in the opposite direction.

A practically identical current-voltage characteristic was obtained for a device similar to that discussed in connection with FIG. 1D using a alloyed p-n junction formed from an indium-zinc alloy.

The current-voltage characteristics, threshold conditions, switching properties and their stability appear to depend upon the donor concentration, the deep center content, and the fabrication processes. The choice of electrode metals is apparently of secondary importance. In some instances units are fabricated which require very small or virtually no reverse bias voltage to switch back to the reversely polarized (RP) state. On the other hand, regardless of the metals and the deep center (oxygen) content, it has been found difficult to observe the effects described hereinabove with heavily doped crystals. Also, crystals with a relatively high defect density tend to facilitate the observation of the above-described phenomena. It has also been noted that the basic behavior of the effect is substantially unchanged by variations in temperature between −40° C. and 100° C. except that switching speed is increased with increasing temperature. Once the device has been switched into its high or low resistance state, either state appears to last indefinitely with no applied voltage at room temperature.

While the explanation of the phenomena involved is not fully understood, it is possible to explain the observed duplex or multiplex current-voltage characteristics on the assumption that the deep centers created have an inherent bistability. A deep center has stable and metastable ground states and the transition between them occurs spontaneously with increasing electric field strength in the reverse polarization condition and with increasing injected electron and hole densities in the forwardly polarized condition. It is believed that deep centers are distributed throughout the space charge region with higher concentrations near the surface. Therefore, with higher reverse bias voltages, more centers become involved in the effect resulting in a higher degree of polarization. In the forward direction, however, the current level, the amount of injected carriers, may play an important role. Just like the current controlled negative resistance, once switching starts at point A in FIG. 2, it will be accelerated going rapidly all the way through to the fully polarized point B. The transition involved may not be purely electronic. With the electronic configuration change, the center may rearrange its structure including a repositioning of the lattice site and a changing of the magnitude and direction of the lattice distortion. The different states of the center may give rise to different potential profiles in the space charge region as indicated by capacitance measurements (the junction width) and results in the two-fold or multifold or transport properties.

The dc power required to make devices of the present invention switch is only 1 to 20 milliwatts the lower power being required for the forward switching. In addition to a simple fabrication process, the switching characteristics achieved and the low power requirements make this device suitable for information storage applications. Thus, one state, the forwardly polarized state, for example, could be characterized as a binary "0" state while the reversely polarized state could be characterized as a binary "1" state. As indicated hereinabove, once these devices have been set in a high or a low resistance state, that state is maintained indefinitely until changed. Writing a binary "0" is accomplished by applying a positive pulse which exceeds the forward switching threshold. In like manner, writing of a binary "1" is accomplished by applying a negative pulse which exceeds the reverse switching threshold. Reading of the state assumed may be simply accomplished by techniques well known to those skilled in the memory arts and, in this instance, is always carried out by applying a small forward bias to the device where the difference in current levels between the two states is quite large.

While the invention has been particularly shown and described with reference to preferred embodiments thereof, it will be understood by those skilled in the art that changes in the steps and details may be made without departing from the spirit of the invention.

What is claimed is:

1. A semiconductor diode which exhibits multiple current-voltage (IV) characteristics comprising:
   - a semiconductor substrate,
   - a region containing deep centers disposed in said substrate, the concentration of said deep centers being highest near said substrate surface, and
   - a semiconductor junction having a region of high field intensity associated with it electrically coupled to said region, said high field intensity region and said highest concentration of deep centers being substantially coincident.

2. A semiconductor diode according to claim 1 further including an ohmic contact electrically coupled to said substrate.

3. A semiconductor diode according to claim 1 wherein said semiconductor substrate is doped gallium arsenide.

4. A semiconductor diode according to claim 1 wherein said semiconductor substrate is doped silicon.

5. A semiconductor diode according to claim 1 wherein said semiconductor substrate is doped with an n-conductivity type dopant.

6. A semiconductor diode according to claim 1 wherein said semiconductor substrate is doped with a p-conductivity type dopant.

7. A semiconductor diode according to claim 1 wherein said deep centers are materials selected from the group consisting of oxygen and metal ions.

8. A semiconductor diode according to claim 1 wherein said deep center is oxygen.

9. A semiconductor diode according to claim 1 wherein said semiconductor junction is defined by an alloyed region of conductive material in said region.

10. A semiconductor diode according to claim 1 wherein said semiconductor junction is defined by a diffused region of dopant in said region.

11. A semiconductor diode according to claim 1 wherein said semiconductor junction is defined by a Schottky barrier forming conductive material disposed in contacting relationship with the surface of said region.

12. A semiconductor diode according to claim 2 further including means for applying a voltage to said diode sufficient to cause said diode to switch between high and low resistance conditions.

13. A semiconductor diode according to claim 2 wherein said ohmic contact is a conductive material selected from the group consisting of metals and alloys of said metals.

14. A semiconductor diode according to claim 5 wherein said n-conductivity type dopant is one selected from the group consisting of tellurium, tin, selenium and sulphur.

15. A semiconductor diode according to claim 6 wherein said p-conductivity type dopant is one selected from the group consisting of zinc and cadmium.

16. A semiconductor diode according to claim 7 wherein said metal ions are elements selected from the group consisting of gold, iron, cobalt, zinc, manganese, copper and nickel.

17. A semiconductor diode according to claim 9 wherein said conductive material is one selected from the group consisting of zinc, cadmium, tin, tellurium, selenium containing alloys and sulphur containing alloys.

18. A semiconductor diode according to claim 10 wherein said dopant is one selected from the group consisting of n-conductivity and p-conductivity type dopants.

19. A semiconductor diode according to claim 11 wherein said Schottky barrier forming conductive material is one selected from the group consisting of platinum, gold, silver molybdenum and palladium.

20. A semiconductor diode according to claim 12 wherein said means for applying a voltage includes means for applying a voltage in the forward direction to said diode until the current attained switches to a higher value of current.

21. A semiconductor diode according to claim 12 wherein said means for applying a voltage includes means for applying a voltage in the reverse direction to said diode until the current attained switches to a lower value of current.

22. A semiconductor diode which exhibits multiple current-voltage (IV) characteristics comprising:
   - a doped semiconductor substrate,
   - a region containing deep centers disposed in said substrate, the concentration of said deep centers being highest near said substrate surface,
   - a semiconductor junction having a space charge region associated with it electrically coupled to said region and said highest concentration of deep centers being substantially coincident,
   - an ohmic contact electrically connected to said substrate, and
   - means connected to said junction and said ohmic contact to switch said diode between high and low resistance conditions.

* * * * *